(12) United States Patent
Wu

(10) Patent No.: US 12,057,852 B2
(45) Date of Patent: Aug. 6, 2024

(54) SAMPLING CLOCK PHASE MISMATCH ERROR ESTIMATION METHOD AND APPARATUS, AND STORAGE MEDIUM

(71) Applicant: SANECHIPS TECHNOLOGY CO., LTD., Shenzhen (CN)

(72) Inventor: Gang Wu, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/772,970

(22) PCT Filed: Oct. 29, 2020

(86) PCT No.: PCT/CN2020/124788
§ 371 (c)(1),
(2) Date: Apr. 28, 2022

(87) PCT Pub. No.: WO2021/083268
PCT Pub. Date: May 6, 2021

(65) Prior Publication Data
US 2024/0162911 A1    May 16, 2024

(30) Foreign Application Priority Data

Oct. 31, 2019   (CN) .......................... 201911056409.4

(51) Int. Cl.
*H03M 1/06*  (2006.01)
(52) U.S. Cl.
CPC ................. *H03M 1/0607* (2013.01)
(58) Field of Classification Search
CPC ............... H03M 1/06; H03M 1/0607
See application file for complete search history.

(56) References Cited

U.S. PATENT DOCUMENTS 7,227,479 B1 *   6/2007   Chen ................... H03M 1/1004
                                                       341/169
9,209,844 B2 *   12/2015   Han ........................ H04B 1/06
(Continued)

FOREIGN PATENT DOCUMENTS

CN    103312329 A    9/2013
CN    108809306 A    11/2018
(Continued)

OTHER PUBLICATIONS

Li Jing et al: "A Digital Timing Mismatch Calibration Technique in Time-Interleaved ADCs", IEEE Transactions on Circuits and Systems II: Express Briefs, IEEE, USA, vol. 61, No. 7, May 29, 2014 (May 29, 2014), pp. 486-490.

(Continued)

*Primary Examiner* — Lam T Mai
(74) *Attorney, Agent, or Firm* — Morgan, Lewis & Bockius LLP

(57) ABSTRACT

Provided are a sampling clock phase mismatch error estimation method and apparatus, and a storage medium. This sampling clock phase mismatch error estimation method includes: a proportional relation between an estimation operator of a modular square subtraction method corresponding to each frequency interval of multiple frequency intervals and a sampling clock phase mismatch error of a time-interleaved analog to digital converter (TIADC) is acquired; a slope and an offset value of a fitting proportion line segment are counted; and a slope of a proportion line segment corresponding to a real-time estimation frequency is converted, and an offset value corresponding to the real-time estimation frequency is estimated through an interpolation according to a counted slope and a counted offset value, and the actual value of the sampling clock phase (Continued)

mismatch error is estimated according to a converted slope and an offset value estimated through the interpolation.

20 Claims, 4 Drawing Sheets

(56) References Cited

U.S. PATENT DOCUMENTS

| | | | | |
|---|---|---|---|---|
| 9,231,608 | B1* | 1/2016 | Pupalaikis | H03M 1/1038 |
| 9,319,058 | B1* | 4/2016 | Yu | H03M 1/1038 |
| 9,444,480 | B1* | 9/2016 | Zanchi | H03M 1/1061 |
| 11,451,235 | B2* | 9/2022 | Chen | H03M 1/0663 |
| 2006/0017599 | A1* | 1/2006 | Elbornsson | H03M 1/0624 |
| | | | | 341/155 |
| 2006/0165198 | A1* | 7/2006 | Tietjen | H04L 27/3845 |
| | | | | 375/331 |
| 2007/0133722 | A1* | 6/2007 | Agazzi | H04L 25/03057 |
| | | | | 375/233 |
| 2009/0278716 | A1* | 11/2009 | Kawahito | G11C 27/026 |
| | | | | 341/122 |
| 2010/0192027 | A1* | 7/2010 | Johansson | H03M 1/0626 |
| | | | | 714/E11.023 |
| 2010/0253414 | A1* | 10/2010 | Dedic | H03M 1/121 |
| | | | | 327/415 |
| 2011/0001645 | A1* | 1/2011 | Messier | H03M 1/1042 |
| | | | | 341/120 |
| 2012/0262318 | A1* | 10/2012 | Straayer | H03M 1/1057 |
| | | | | 341/120 |
| 2012/0274491 | A1* | 11/2012 | Kidambi | H03M 1/1019 |
| | | | | 341/118 |
| 2012/0326902 | A1 | 12/2012 | Anthony et al. | |
| 2014/0152477 | A1* | 6/2014 | Lewis | H03M 1/1061 |
| | | | | 341/122 |
| 2014/0152478 | A1* | 6/2014 | Lewis | H03M 1/0673 |
| | | | | 341/123 |
| 2015/0061905 | A1* | 3/2015 | Kappes | H03M 1/1071 |
| | | | | 341/120 |
| 2015/0303934 | A1* | 10/2015 | Chiu | H03M 1/36 |
| | | | | 341/120 |
| 2015/0381193 | A1* | 12/2015 | Qiu | H03M 1/1033 |
| | | | | 341/118 |
| 2016/0049949 | A1* | 2/2016 | Waltari | H03M 1/1023 |
| | | | | 341/120 |
| 2016/0149582 | A1* | 5/2016 | Ragab | H03M 1/121 |
| | | | | 341/120 |
| 2017/0041011 | A1* | 2/2017 | Venkatraman | H03M 1/1009 |
| 2017/0117914 | A1* | 4/2017 | Choi | H03M 1/1033 |
| 2017/0264308 | A1* | 9/2017 | Danson | H03M 1/0678 |
| 2018/0026781 | A1* | 1/2018 | Otte | H04L 7/02 |
| | | | | 375/355 |
| 2019/0131990 | A1* | 5/2019 | Ali | H03M 1/0639 |
| 2019/0305791 | A1* | 10/2019 | Ali | H03M 1/0639 |
| 2020/0162092 | A1* | 5/2020 | Ali | H03M 1/0639 |
| 2020/0195265 | A1* | 6/2020 | Ali | H03H 7/42 |
| 2021/0159908 | A1* | 5/2021 | Singh | H03M 1/0626 |
| 2021/0281271 | A1* | 9/2021 | Bales | H03M 1/1215 |
| 2021/0409032 | A1* | 12/2021 | Bal | H03M 1/0624 |
| 2022/0149854 | A1* | 5/2022 | Menkus | H03M 1/0678 |

FOREIGN PATENT DOCUMENTS

| | | |
|---|---|---|
| CN | 110113049 A | 8/2019 |
| CN | 110266311 A | 9/2019 |

OTHER PUBLICATIONS

Salib Armia et al: "A High-Precision Time Skew Estimation and Correction Technique for Time-Interleaved ADCs", IEEE Transactions on Circuits and Systems I: Regular Papers, IEEE, US, vol. 66, No. 10, May 29, 2019 (May 29, 2019), pp. 3747-3760.

International Search Report for Application No. PCT/CN2020/124788, dated Jan. 27, 2021, 4 pages including English translation.

* cited by examiner

SAMPLING CLOCK PHASE MISMATCH ERROR ESTIMATION METHOD AND APPARATUS, AND STORAGE MEDIUM

CROSS-REFERENCE TO RELATED APPLICATIONS

This is a National Stage Application filed under 35 U.S.C. 371 based on International Patent Application No. PCT/CN2020/124788, filed on Oct. 29, 2020, which claims priority to Chinese Patent Application No. 201911056409.4 filed on Oct. 31, 2019, the disclosures of both of which are incorporated herein by reference in their entireties.

TECHNICAL FIELD

The present application relates to the field of communications and, for example, to a sampling clock phase mismatch error estimation method and apparatus, and a storage medium.

BACKGROUND

In a 5th-Generation (5G) mobile communication system, the system rate has been greatly improved over 4G, and the corresponding base station and terminal have higher performance demands for an analog to digital converter (ADC). Time-interleaved ADC (TIADC) is a mainstream technology for high-speed, high-performance ADCs, and the TIADC is often the first choice for the ADC in the 5G system.

The TIADC is composed of multiple paths of sub-ADCs with a same resolution, the multiple paths of sub-ADCs are used for alternately sampling and converting input signals, and finally, respective outputs of the sub-ADCs are alternately output through a multiplexer (MUX), so that a sampling rate is improved exponentially. As shown in FIG. 1, M parallel sub-ADCs form an M channel TIADC, a sampling rate of each sub-ADC is $f_s/M$, each sub-ADC periodically samples analog input signals in sequence through its own sample/Hold (S/H) circuit, the sampling time of the m-th sub-channel is $t_m = nMT_s + mT_s$, where $n=0,1,2,\ldots$, $m=0,1,2,\ldots,M-1$, $T_s$ is a sampling period, then output results of the sub-ADCs are subjected to the data reconstruction by the MUX, and thus an overall sampling frequency $f_s$ of M times the sub-ADC sampling frequency is obtained.

Due to a fact that complete symmetry and matching of multiple channels are difficult to achieve in the layout design, a mismatching phenomenon among multiple sub-channels of the TIADC will be caused due to changes of environmental conditions such as temperature and voltage in a chip manufacturing process. In order to achieve a high-speed and high-performance TIADC and satisfy ADC requirements of the 5G mobile communication system, the error estimation and error compensation must be respectively performed on the mismatches, otherwise, the performance of the whole system can be seriously affected. The mismatches in a TIADC system generally include three kinds: an offset mismatch, a gain mismatch and a sampling clock phase mismatch. In the three mismatch errors, the introduction of bias and gain errors can bring regular changes of output signals, a sampling clock phase mismatch error is mainly caused by aperture jitter and time delay inconsistency among multiple sub-channels, and even though sampling clock phase mismatch errors of the multiple channels are fixed, along with the increase of the frequency of the input signals, the influence of a final sampling clock phase mismatch error on the performance of the ADC is also increased, and the characteristic which changes along with the change of the frequency of the input signals cannot be directly identified from the output results, so that the influence of the characteristic on the system performance is much greater than that of a bias error and a gain error.

For the sampling clock phase mismatch error estimation, all-digital blind self-adaptive estimation is generally practical, the modular square subtraction method is a common method for all-digital blind self-adaptive estimation, and the method is characterized in that an estimation operator of the modular square subtraction and estimation of the sampling clock phase mismatch error are considered to present a certain linear proportional relation, and an error value is estimated therefrom. However, as a number of the sub-ADCs increases, the linear proportion is not very strict, and the estimation error is increased accordingly.

SUMMARY

The present disclosure provides a sampling clock phase mismatch error estimation method and apparatus, and a storage medium, and aims to at least solve a problem that the estimation error is increased along with the increase of a number of sub-ADCs in the modular square subtraction method of the sampling clock phase mismatch error estimation.

Provided is a sampling clock phase mismatch error estimation method, the method includes described below. a proportional relation between an estimation operator of a modular square subtraction method corresponding to each frequency interval of multiple frequency intervals and a sampling clock phase mismatch error of a time-interleaved analog to digital converter (TIADC) is acquired; a statistic is performed on a slope and an offset value of a fitting proportion line segment between an actual value of a sampling clock phase mismatch error and an estimation value of the sampling clock phase mismatch error corresponding to a frequency demarcation point of each frequency interval of the multiple frequency intervals, where the estimation value of the sampling clock phase mismatch error is determined according to a proportional relation corresponding to each frequency interval; and in a real-time estimation of the sampling clock phase mismatch error of the TIADC, a slope of a proportion line segment corresponding to a real-time estimation frequency is converted according to an estimation value of the sampling clock phase mismatch error obtained by the estimation operator of the modular square subtraction method, and an offset value corresponding to the real-time estimation frequency is estimated through an interpolation according to a counted slope and a counted offset value, and the actual value of the sampling clock phase mismatch error is estimated according to a converted slope and an offset value estimated through the interpolation.

Further provided is a sampling clock phase mismatch error estimation apparatus. The sampling clock phase mismatch error estimation apparatus includes a partitioning module, a statistic module and an estimation module. The partitioning module is configured to acquire a proportional relation between an estimation operator of a modular square subtraction method corresponding to each frequency interval of multiple frequency intervals and a sampling clock phase mismatch error of a time-interleaved analog to digital converter (TIADC), where a proportional relation corresponding to each frequency interval is approximately linear.

The statistic module is configured to perform an offline statistic on a slope and an offset value of a fitting proportion line segment between an actual value of a sampling clock phase mismatch error and an estimation value of the sampling clock phase mismatch error corresponding to a frequency demarcation point of each frequency interval of the multiple frequency intervals, and store the slope and the offset value of the offline statistic, where the estimation value of the sampling clock phase mismatch error is determined according to a proportional relation corresponding to each frequency interval. The estimation module is configured to convert, in a real-time estimation of the sampling clock phase mismatch error of the TIADC, a slope of a proportion line segment corresponding to a real-time estimation frequency according to an estimation value of the sampling clock phase mismatch error obtained by the estimation operator of the modular square subtraction method, find out a slope range corresponding to a slope of a proportional line segment corresponding to the real-time estimation frequency from the slopes performing the offline statistic, and obtain an offset value of a demarcation point of the slope range, estimating an offset value of a real-time estimated frequency through an interpolation, and estimate the actual value of the sampling clock phase mismatch error according to a converted slope and an offset value estimated through the interpolation.

Further provided is a non-transitory computer-readable storage medium. The storage medium stores a computer program, where the computer program is configured to, when being executed, implement the sampling clock phase mismatch error estimation method described above.

Further provided is an electronic apparatus. The electronic apparatus includes a memory and a processor, where the memory stores a computer program, and the processor is configured to execute the computer program to perform the sampling clock phase mismatch error estimation method described above.

DETAILED DESCRIPTION

The present disclosure will be described in conjunction with the embodiments and with reference to the accompanying drawings hereinafter.

The terms "first", "second" and the like herein are used for distinguishing between similar objects and not necessarily for describing a particular sequence or sequential order.

Figure 1:
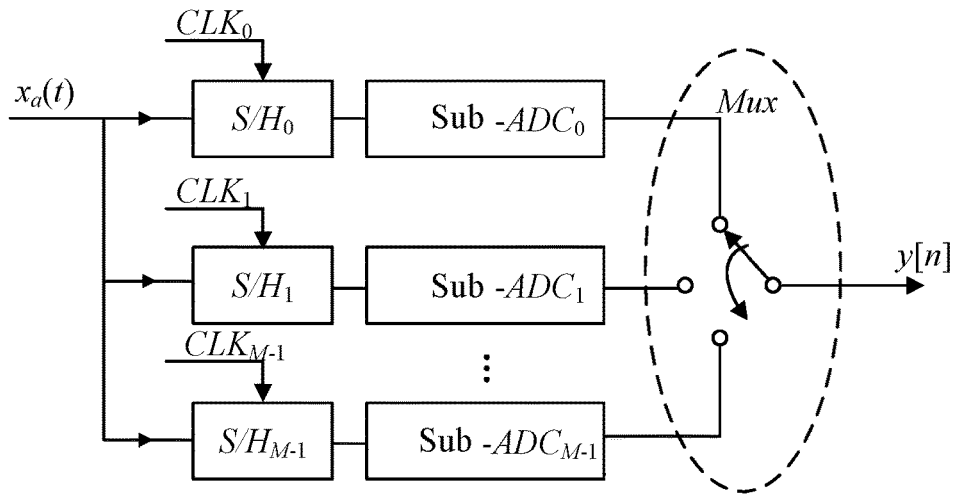
FIG. 1 is a schematic diagram of a TIADC architecture.
Figure 2:
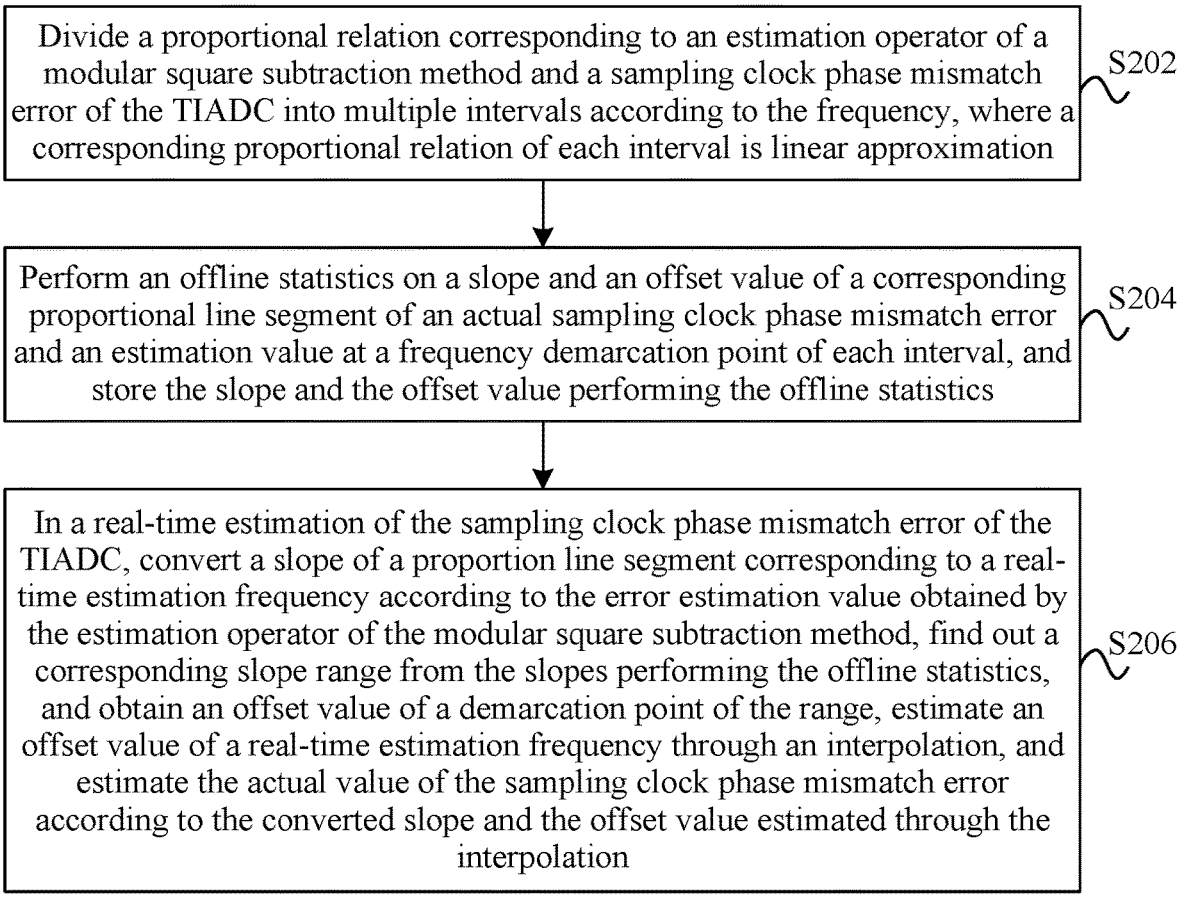
FIG. 2 is a flowchart of a sampling clock phase mismatch error estimation method provided in an embodiment of the present disclosure.

In this embodiment, a sampling clock phase mismatch error estimation method is provided, FIG. 2 is a flowchart of a sampling clock phase mismatch error estimation method provided in an embodiment of the present disclosure, and as shown in FIG. 2, the flow includes the following:

In S202, a proportional relation corresponding to an estimation operator of a modular square subtraction method and a sampling clock phase mismatch error of the TIADC is divided into multiple intervals according to the frequency, where a corresponding proportional relation of each interval is linear approximation.

In S204, an offline statistic is performed on a slope and an offset value of a corresponding proportional line segment of an actual sampling clock phase mismatch error and an estimation value at a frequency demarcation point of each interval, and the slope and the offset value performing the offline statistic is stored.

In S206, in a real-time estimation of the sampling clock phase mismatch error of the TIADC, a slope of a proportion line segment corresponding to a real-time estimation frequency is converted according to the error estimation value obtained by the estimation operator of the modular square subtraction method, a corresponding slope range is found out from the slopes performing the offline statistic, and an offset value of a demarcation point of the range is obtained, an offset value of a real-time estimation frequency is estimated through an interpolation, and the actual value of the sampling clock phase mismatch error is estimated according to the converted slope and the offset value estimated through the interpolation.

In S202 of this embodiment, assuming that frequencies corresponding to multiple demarcation points of (M+1) intervals are $f_0, f_1, \ldots, f_i, f_{i+1}, \ldots, f_{M-1}$, for a frequency point $f_i$, an actual sampling clock phase mismatch error range is divided at 2N equal intervals, and multiple actual sampling clock phase mismatch error points are $$-aT_s, -\frac{N-1}{N}aT_s, \ldots, -\frac{1}{N}aT_s, 0, \frac{1}{N}aT_s, \ldots, \frac{N-1}{N}aT_s, aT_s,$$

respectively, where, $T_s$ is a system sampling period, and a is a constant number.

In S204 of this embodiment, a statistic is performed according to an estimation operator $E\lfloor(x_2-x_1)^2\rfloor - E\lfloor(x_3-x_2)^2\rfloor$ of the modular square subtraction method to obtain an estimation value $s_{-N}, s_{-(N-1)}, \ldots, s_{-1}, 0, s_1, \ldots, s_{(N-1)}, s_N$ corresponding to each sampling clock phase mismatch error point; a linear fitting is performed on multiple actual sampling clock phase mismatch error points $$-aT_s, -\frac{N-1}{N}aT_s, \ldots, -\frac{1}{N}aT_s, 0, \frac{1}{N}aT_s, \ldots, \frac{N-1}{N}aT_s, aT_s$$

and corresponding estimation values $s_{-N}, s_{-(N-1)}, \ldots, s_{-1}, 0, s_1, \ldots, s_{(N-1)}, s_N$ to obtain a slope $k_1$ of a sampling clock phase mismatch error line segment corresponding to the frequency point $f_i$ and an offset value $b_i$ in a case where the sampling clock phase mismatch error is 0; a same operation is performed for other frequency demarcation points to obtain slopes of sampling clock phase mismatch error line segments corresponding to different frequency points and offset values in a case where the sampling clock phase mismatch error is 0; and slopes $k_0, k_1, \ldots, k_i, k_{i+1}, \ldots, k_{M-1}$ and offset values $b_0, b_1, \ldots, b_i, b_{i+1}, \ldots b_{M-1}$ corresponding to the multiple frequency points $f_0, f_1, \ldots, f_i, f_{i+1}, \ldots, f_{M-1}$ are stored.

In S206 of this embodiment, the slope k of the proportion line segment corresponding to the real-time estimation frequency is converted according to the estimation value obtained by the estimation operator of the modular square subtraction method; an obtained k is inquired in $k_0$, $k_1, \ldots, k_i, k_{i+1}, \ldots, k_{M-1}$ to find that a slope range corresponding to the obtained k is between $k_i$ and $k_{i+1}$; and an offset value b corresponding to the real-time estimation frequency is estimated through a following interpolation:

$$A = \frac{k_{i+1} - k}{k - k_i} = \frac{b_{i+1} - b}{b - b_i}; b = (b_{i+1} + Ab_i)/(1 + A)$$

Before S206 of this embodiment, the method may further include that: the TIADC samples an input signal, and the error estimation value is calculated by using the modular square subtraction method.

After S206 of this embodiment, the method may further include that: the estimated actual value of the sampling clock phase mismatch error is output to a compensator for an error compensation.

In the embodiments of the present disclosure, through the above, a problem that the estimation error is increased along with the increase of a number of the sub-ADCs in the modular square subtraction method of the sampling clock phase mismatch error estimation is solved, the estimation precision is improved to satisfy the high-speed and high-performance requirements of the system for the ADC, and meanwhile, the processing complexity is not increased excessively.

In order to facilitate the understanding of the embodiments of the present disclosure, the following description will be made with reference to specific application embodiments.

Figure 3:
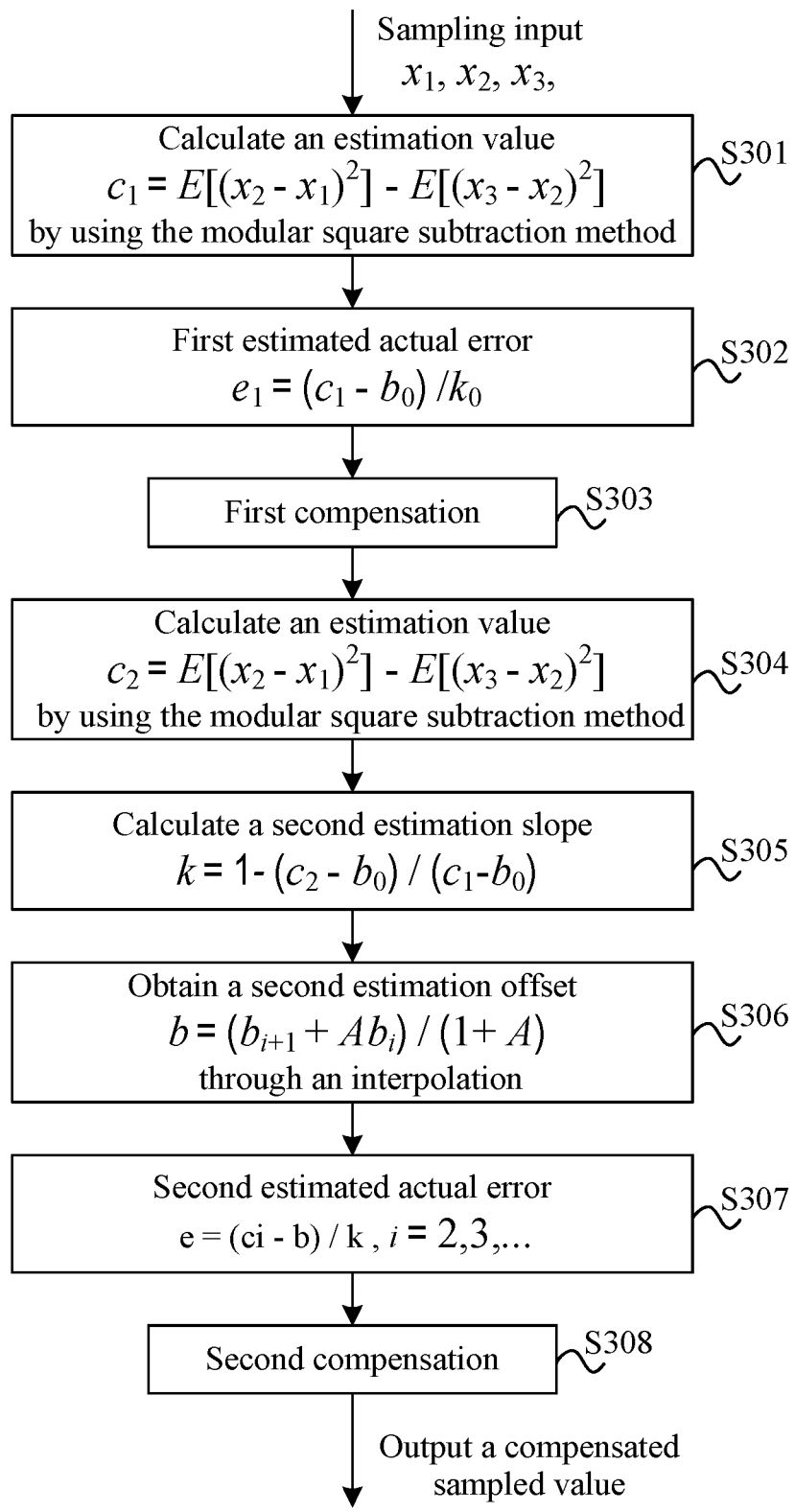
FIG. 3 is a flowchart of a blind adaptive process provided in an embodiment of the present disclosure.

In this embodiment, a new sampling clock phase mismatch error estimation method is provided, as shown in FIG. 3, and the method of this embodiment mainly includes the following:

In S301, the input signal is sampled, the sampling point is $x_1$, $x_2$ and $x_3$ and a first $c_1 = E[(x_2-x_1)^2] - E[(x_3-x_2)^2]$ error estimation value 1 is calculated by using the modular square subtraction method.

In S302, a first actual error estimation value $e=(c_1-b_0)/k_0$ is converted based on an initial slope $k_0$ and an offset $b_0$ of a proportion line segment corresponding to a calculated error value and the actual error value.

In S303, the first actual error estimation value is output to the compensator to perform a first error compensation.

In S304, for a compensated sampling signal, a second error estimation value $c_2=E[(x_2-x_1)^2]-E[(x_3-x_2)^2]$ is calculated by using the modular square subtraction method.

In S305, a second estimation slope $k=1-(c_2-b_0)/(c_1-b_0)$ is calculated based on the estimation value.

In S306, a second estimation offset $b=(b_{i+1}+Ab_i)/(1+A)$ is calculated through an interpolation.

In S307, a second actual error estimation value $e=(c_2-b)/k$ is converted.

In S308, the second actual error estimation value is output to a compensator for a second error compensation.

Figure 4:
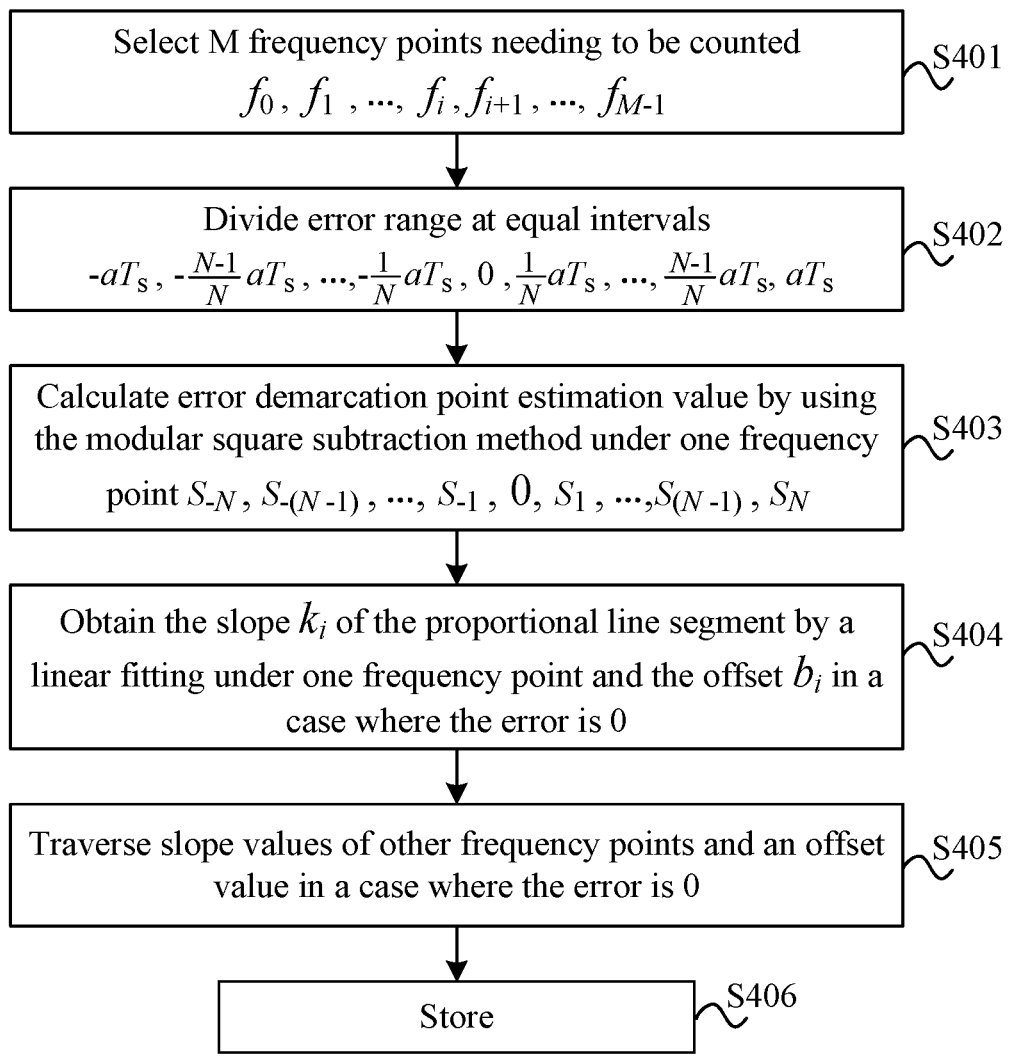
FIG. 4 is a flowchart of offline statistic slope and offset provided in an embodiment of the present disclosure.

The initial slope and the offset of the proportional line segment corresponding to the calculated error value and the actual error value are obtained by the offline statistic, and as shown in FIG. 4, the slope and the offset value of each frequency point need to be counted in a segmented and long-time manner. The method includes the following:

In S401, M frequency points needing to be counted are selected, and assuming that a corresponding frequency of multiple demarcation points of (M+1) intervals is $f_0$, $f_1, \ldots, f_i, f_{i+1}, \ldots, f_{M-1}$, the sampling clock phase mismatch error range required by the system is $[-aT_s, aT_s]$ where $T_s$ is a system sampling period, and a is a constant number. Offset values of multiple sampling clock phase mismatch error points are scanned and counted at equal intervals within the sampling clock phase mismatch error range required by the system for each frequency point.

In S402, for example, for $f_i$, the actual sampling clock phase mismatch error range is divided at 2N equal intervals, and the multiple actual sampling clock phase mismatch error points are $$-aT_s, -\frac{N-1}{N}aT_s, \ldots, -\frac{1}{N}aT_s, 0, \frac{1}{N}aT_s, \ldots, \frac{N-1}{N}aT_s, aT_s,$$

respectively.

In S403, an estimation value $s_{-N}, s_{-(N-1)}, \ldots, s_{-1}, 0, s_1, \ldots, s_{(N-1)}, s_N$ of each sampling clock phase mismatch error point is obtained through the long-term statistic according to an estimation operator $E[(x_2-x_1)^2]-E[(x_3-x_2)^2]$ of the modular square subtraction method.

In 404, a linear fitting is performed on the multiple actual sampling clock phase mismatch error points $$-aT_s, -\frac{N-1}{N}aT_s, \ldots, -\frac{1}{N}aT_s, 0, \frac{1}{N}aT_s, \ldots, \frac{N-1}{N}aT_s, aT_s$$

and corresponding estimation values $s_{-N}, s_{-(N-1)}, \ldots, s_{-1}, 0, s_1, \ldots, s_{(N-1)}, s_N$ to obtain a slope $k_i$ of a sampling clock phase mismatch error line segment corresponding to the frequency demarcation point $f_i$ and an offset value $b_i$ in a case where the sampling clock phase mismatch error is 0.

In S405, a similar operation is performed on other frequency points to obtain slopes of sampling clock phase mismatch error line segments of different frequency points and an offset value in a case where the sampling clock phase mismatch error is 0.

In S406, finally, slopes $k_0, k_1, \ldots, k_i, k_{i+1}, \ldots, k_{M-1}$ and offset values $b_0, b_1, \ldots, b_i, b_{i+1}, \ldots, b_{M-1}$ corresponding to the multiple frequency points $f_0, f_1, \ldots, f_i, f_{i+1}, \ldots, f_{M-1}$ are stored.

In this embodiment, the proportional relation between the estimation operator of the modular square subtraction method and the sampling clock phase mismatch error is divided into multiple intervals according to frequency, where a corresponding proportion of each interval is linear approximation. The slope and offset value of the proportional line segment corresponding to the actual sampling clock phase mismatch error and the estimation value under each interval frequency demarcation point are counted for a long time offline, and the slope and offset value are stored for subsequent real-time estimation.

In the real-time estimation, a slope of a corresponding proportional line segment under the real-time estimation frequency is converted according to an estimation value obtained by the estimation operator of the modular square subtraction method, then a corresponding slope range is found in the previously stored slopes, further an offset value of a demarcation point of the range is obtained, then the offset value of the real-time estimation frequency is estimated through an interpolation, and finally the actual value of the sampling clock phase mismatch error is estimated through the slope and the offset value.

The above technical scheme provided in this embodiment is suitable for a scene with a large number of sub ADC channels, and an actually estimation frequency is not limited to a single audio point and is also suitable for a comprehensive frequency scene under multiple audio points.

The specific implementation process of this embodiment will be described below in conjunction with the modular square subtraction method and the blind self-adaptive processing thereof.

1. Modular Square Subtraction Method

Figure 5:
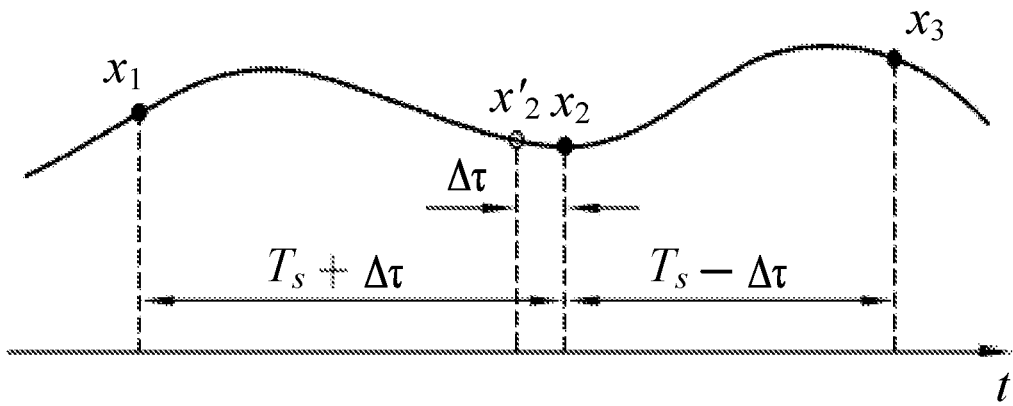
FIG. 5 is a schematic diagram of a two-channel TIADC clock sampling point position provided in an embodiment of the present disclosure.

A two-channel TIADC is used as an example to describe the modular square subtraction method, as shown in FIG. 5, assuming that both offset mismatch and gain mismatch of the system are corrected, when there is no sampling time phase mismatch between the two channels, the sampling points of the channel 1 and the channel 2 for the input signal are $x_1$ and $x_2'$, respectively. When a sampling clock phase mismatch error $\Delta\tau$ (far less than a sampling clock period $T_s$) exists in the system, the actual sampling points of the channel 1 and the channel 2 are $x_1$ and $x_2$, and $x_3$ is a sampling point of the channel 1 in the next period is shown in the drawings. If the channel 1 is used as the reference channel, the actual sampling time point $x_2$ of the channel 2 deviates from the time for the ideal sampling time point $x_2$ with the size of $\Delta\tau$. For an input signal whose amplitude varies with time, the presence and size of $\Delta\tau$ causes the value of the sampling point of the channel 2 to vary.

In order to find the relationship between $\Delta\tau$ and sampling points $x_1$ and $x_2$, outputs of the channel 1 and the channel 2 are differenced, respectively, i.e., $(x_2-x_1)$ and $(x_3-x_2)$, and the mathematical expectation is taken for the square of these two terms, i.e., equation (1):

$$E[(x_2-x_1)^2]=E[x_2^2]+E[x_1^2]-2E[x_2x_1]=\sigma_{x_2}^2+\sigma_{x_1}^2-2E[x(t_1+T_s+\Delta\tau)x)(t_1)] \quad (1)$$

$\sigma^2$ denotes the average power of each sampling point, assuming that the average power of the sampling point $x_1$ of the channel 1 and the average power of the sampling point $x_2$ of the channel 2 are the same, $x(t_1)$ denotes a sampling at $t_1$ moment, and $T_s$ denotes the sampling period. $E[x(t_1+T_s+\Delta\tau)x(t_1)]$ is the expectation of the cross correlation function of adjacent sampling points, which is noted $R(T_s+\Delta\tau)$, then the equation (1) may be written as:

$$E[(x_2-x_1)^2]=2\sigma_x^2-2R(T_s+\Delta\tau) \quad (2)$$

Similarly, $$E[(x_3-x_2)^2]=2\sigma_x^2-R(T_s-\Delta\tau) \quad (3)$$

The formulas (2) and (3) are subtracted, the cross correlation function may be expanded by Taylor series when $\Delta\tau$ is very small, only the first derivative is retained to obtain:

$$E[(x_2-x_1)^2]-E[(x_3-x_2)^2]\approx 4\Delta\tau R'(T_s+\Delta\tau) \quad (4)$$

$R'(T_s+\Delta\tau)$ is a first derivative of $R(T_s+\Delta\tau)$ Statistically, when the amount of the sample is sufficiently large, an input frequency $R'(T_s+\Delta\tau)$ for a TIADC system may be considered a deterministic value. Therefore, a fixed proportional relation exists between the measurement on the left side of the equation and $\Delta\tau$, and the fixed proportional relation is a basic estimation operator of the modular square subtraction method.

In the embodiments of the present disclosure, a multi-channel scenario with a large number of ADCs is used as an example, the above 2-channel TIADC is extended to an 8-channel TIADC, the 0th path is used as a reference, the error of the 4th path is estimated, a calibrating is performed, the errors of the 2nd and 6th paths are estimated, and finally, the errors of the 1st, 3rd, 5th and 7th paths are estimated, then the estimation operator of the modular square subtraction method may be written as:

$$\begin{cases} E[(x_4-x_0)^2]-E[(x_8-x_4)^2] \\ E[(x_2-x_0)^2]-E[(x_4-x_2)^2] \\ E[(x_6-x_4)^2]-E[(x_8-x_6)^2] \\ E[(x_1-x_0)^2]-E[(x_2-x_1)^2] \\ E[(x_3-x_2)^2]-E[(x_4-x_3)^2] \\ E[(x_5-x_4)^2]-E[(x_6-x_5)^2] \\ E[(x_7-x_6)^2]-E[(x_8-x_7)^2] \end{cases} \quad (5)$$

2. Blind Self-Adaptive Processing

In an actual system, a frequency of the input signal cannot be known, and the blind self-adaptive estimation needs to be performed. Because of the modular square subtraction method of equation (4), although the input signal frequency and the error estimation mean value are linearly proportional, the error value cannot be directly obtained. Because the slope of the proportional line segment is increased along with the increase of the frequency, and values of line segments under different frequencies are different when no error exists, whereby the blind self-adaptive estimation needs to be performed.

Based on the modular square subtraction method, assuming that the 1st estimation value of the left side of the formula (4) after multiple averaging is $c_1=E[(x_2-x_1)^2]-E[(x_3-x_2)^2]$ then the 1st compensation is performed, the 2nd estimation value of the left side of the formula (4) after multiple averaging is $c_2=E[(x_2-x_1)^2]-E[(x_3-x_2)^2]$, and the actual sampling clock phase mismatch error value is e. If the formula (4) is the linear proportion, the estimation value and the error value are used as the ordinate and the abscissa of the proportional relation line segment, and the slope of the proportional line segment is set to be k, and the offset is set to be b. For the blind processing, the slope initial value k0 and the offset initial value b0 in the 1st estimation are both subjected to offline statistic and set, and then the actual sampling clock phase mismatch error value output by the 1st estimation is:

$$e=(c_1-b_0)/k_0 \quad (6)$$

The 1st compensation is performed after e being sent to the error compensator after the error estimation, because of pipeline processing, the actual sampling clock phase mismatch error value output by performing the 2nd estimation after the 1st compensation is:

$$e-c_1=(c_2-b_0)/k_0 \quad (7)$$

By (6) and (7), a proportional line segment slope may be obtained:

$$k=1-(c_2-b_0)/(c_1-b_0) \quad (8)$$

After the slope k is obtained and the offset b is obtained according to the method in the above S306, the actual sampling clock phase mismatch error value in the second error estimation is:

$$e=(c_2-b)/k \quad (9)$$

Therefore, the blind self-adaptive estimation is realized, and the error estimation may be performed when the frequency of the input signal is unknown. Then the second compensation is performed. And then, through the third estimation and compensation of the formula (6) and the fourth estimation and compensation of the formula (9), the error may be converged after several times of continuous operation. If the TIADC is an 8-path TIADC, the estimation of the 4th path is converged, then the error estimation and compensation of the 2nd path and the 6th path are performed, and finally the error estimation and compensation of the 1st path, the 3rd path, the 5th path and the 7th path are performed.

3. Statistics and Setting of Slope and Offset Correspondence

As described in FIG. 4 of this embodiment, a ratio of the estimation operator of the modular square subtraction method to the sampling clock phase mismatch error is divided offline into multiple intervals by frequency, a corresponding ratio of each interval is linear approximation relation. Assuming that a corresponding frequency of multiple demarcation points of (M+1) intervals is $f_0, f_1, \ldots, f_i, f_{i+1}, \ldots, f_{M-1}$, the sampling clock phase mismatch error range required by the system is $[-aT_s, aT_s]$, where $T_s$ is a system sampling period, and a is a constant number. An offset value of each sampling clock phase mismatch error point is scanned and counted at equal intervals within the sampling clock phase mismatch error range required by the system for each frequency point.

For example, for $f_i$, the actual sampling clock phase mismatch error range is divided at 2N equal intervals, the multiple actual sampling clock phase mismatch error points are $$-aT_s, -\frac{N-1}{N}aT_s, \ldots, -\frac{1}{N}aT_s, 0, \frac{1}{N}aT_s, \ldots, \frac{N-1}{N}aT_s, aT_s,$$

respectively.

An estimation value $s_{-N}, s_{-(N-1)}, \ldots, s_{-1}, 0, s_1, \ldots, s_{(N-1)}, s_N$ of each sampling clock phase mismatch error point is obtained through the long-term statistic according to an estimation operator $E[(x_2-x_1)^2]-E[(x_3-x_2)^2]$ of the modular square subtraction method.

A linear fitting is performed on the multiple actual sampling clock phase mismatch error points $$-aT_s, -\frac{N-1}{N}aT_s, \ldots, -\frac{1}{N}aT_s, 0, \frac{1}{N}aT_s, \ldots, \frac{N-1}{N}aT_s, aT_s$$

and corresponding estimation values $s_{-N}, s_{-(N-1)}, \ldots, s_{-1}, 0, s_1, \ldots, s_{(N-1)}, s_N$ to obtain a slope $k_i$ of a sampling clock phase mismatch error line segment corresponding to the frequency demarcation point $f_i$ and an offset value $b_i$ in a case where the sampling clock phase mismatch error is 0.

A similar operation is performed on other frequency points to obtain slopes of sampling clock phase mismatch error line segments of different frequency points and an offset value in a case where the sampling clock phase mismatch error is 0.

Finally, slopes $k_0, k_1, \ldots, k_i, k_{i+1}, \ldots, k_{M-1}$ and offset values $b_0, b_1, \ldots, b_i, b_{i+1}, \ldots, b_{M-1}$ corresponding to the multiple frequency points $f_0, f_1, \ldots, f_i, f_{i+1}, \ldots, f_{M-1}$ are stored.

In this embodiment, the proportional relation between the estimation operator of the modular square subtraction method and the sampling clock phase mismatch error is divided into multiple intervals according to frequency, where a corresponding proportion of each interval is linear approximation. The slope and offset value of the proportional line segment corresponding to the actual sampling clock phase mismatch error and the estimation value under each interval frequency demarcation point are counted for a long time offline, and the slope and offset value are stored for subsequent real-time estimation. The above is the offline statistic process.

In the real-time estimation, the k resulting from equation (8) is queried in $k_0, k_1, \ldots, k_i, k_{i+1}, \ldots, k_{M-1}$, assuming that k is between $k_i$ and $k_{i+1}$, then the offset b used by equation (9) may be considered to be a correspondence as follows:

$$\frac{k_{i+1}-k}{k-k_i} = \frac{b_{i+1}-b}{b-b_i} \quad (10)$$

The value on the left of the above equation is known and denoted as A, then the value of the offset b, may be obtained by equation (10) as:

$$b=(b_{i+1}+Ab_i)/(1+A) \quad (11)$$

This is an interpolation estimation process of the offset value. b is substituted into a formula (9) to obtain an actual sampling clock phase mismatch error value.

In this embodiment, the segmentation and interpolation technical means are introduced, and the conventional processing method does not perform the segmentation, averages the offsets corresponding to the two endpoints as the offset value required in calculation, and obviously does not have the high estimation precision of this embodiment.

In another practical application embodiment of the present disclosure, the performance of the method is evaluated by using an 8-path TIADC as an example. The parameters are set as follows: the sampling rate is 2 GHz, a number of channels M is 8, the offset mismatch error is [0 0 0 0 0 0 0 0], the gain mismatch error is [1 1 1 1 1 1 1 1], the sampling clock phase mismatch error is [0 0.03-0.03 0.03 0.03-0.03 0.03-0.03]Ts, a signal-to-noise ratio of an additive white Gaussian noise (AWGN) channel is 100 dB, the sampling clock phase mismatch error is estimated by using a modular square subtraction method, the statistic data length is estimated at 65536*256 sampling points each time, the error estimation is performed for 8000 times in total, and the bandwidth scans the effective number of bits (ENOB) of the TIADC from 1 MHz~200 MH. After compensation, many frequency points of the ENOB of the conventional averaging method cannot reach 12 bits, but the ENOB of the segmented interpolation method provided in the embodiments of the present disclosure may reach more than 12 bits, so that the sampling requirement of the 5G system is satisfied.

According to the embodiments of the present disclosure, an offline statistic is performed on the slope and the offset of a proportional line segment storing part of frequency points, in the actual estimation, the real-time slope and offset value are obtained only by linear interpolation, therefore the processing is simple, and the excessive increase of the complexity is not caused.

Through the description of the above embodiments, the method described in the above embodiments may be implemented by means of software plus a necessary universal hardware platform, or by means of hardware. The technical scheme of the present disclosure may be embodied in the form of a software product, this computer software product is stored in a storage medium (such as a Read-Only Memory (ROM)/Random Access Memory (RAM), a magnetic disk, an optical disc), and includes several instructions for causing a terminal device (which may be a mobile phone, a computer, a server, or a network device, etc.) to perform the methods described in the embodiments of the present disclosure.

Also provided in this embodiment is a sampling clock phase mismatch error estimation apparatus, the apparatus is configured to implement the above embodiments and implementations, which have been described without further details. As used below, the term "module" or "unit" may be a combination of software and/or hardware implementing a predetermined function. Although the apparatus described in the embodiments below is implemented in software, implementations in hardware, or a combination of software and hardware, are also possible and contemplated.

Figure 6:
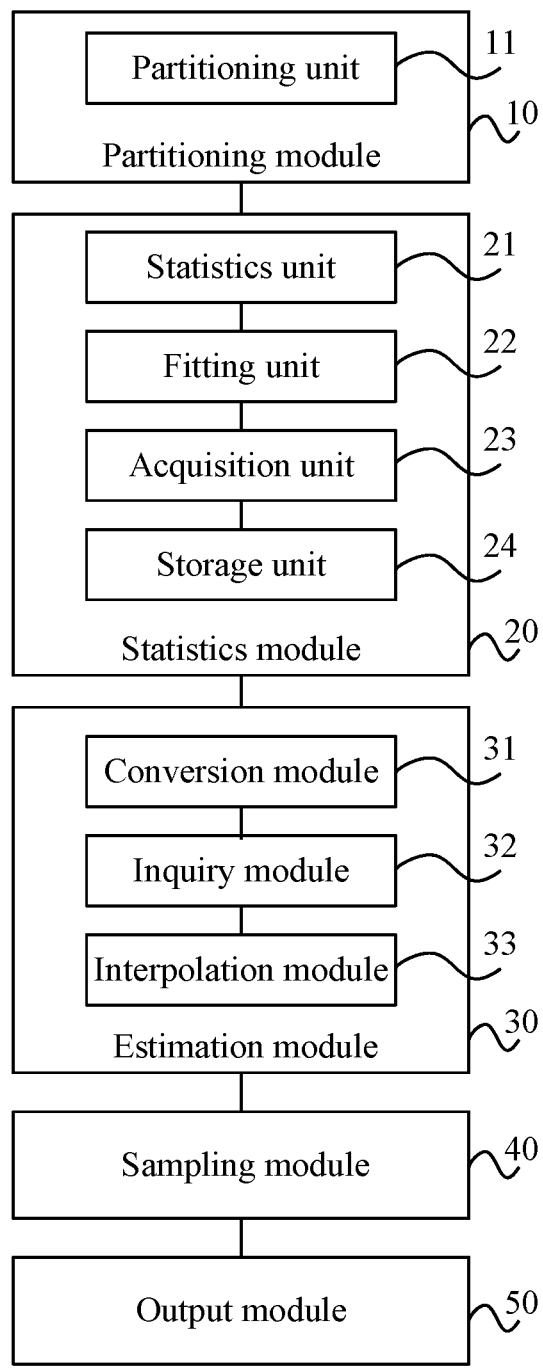
FIG. 6 is a structural schematic diagram of a sampling clock phase mismatch error estimation apparatus provided in an embodiment of the present disclosure.

FIG. 6 is a block diagram of a sampling clock phase mismatch error estimation apparatus provided in an embodiment of the present disclosure, as shown in FIG. 6, and the apparatus includes a partitioning module 10, a statistic module 20 and an estimation module 30.

The partitioning module 10 is configured to divide a proportional relation corresponding to an estimation operator of a modular square subtraction method and a sampling clock phase mismatch error of the TIADC into multiple intervals according to the frequency, where a corresponding proportional relation of each interval is linear approximation.

The statistic module 20 is configured to perform an offline statistic on a slope and an offset value of a corresponding proportional line segment of an actual sampling clock phase mismatch error and an estimation value at a frequency demarcation point of each interval, and store the slope and the offset value performing the offline statistic.

The estimation module 30 is configured to convert, in a real-time estimation of the sampling clock phase mismatch error of the TIADC, a slope of a proportion line segment corresponding to a real-time estimation frequency according to the error estimation value obtained by the estimation operator of the modular square subtraction method, a corresponding slope range is found out from the slopes performing the offline statistic, and an offset value of a demarcation point of the range is obtained, an offset value of a real-time estimation frequency is estimated through an interpolation, and the actual value of the sampling clock phase mismatch error is estimated according to the converted slope and the offset value estimated through the interpolation.

In an embodiment, the partitioning module 10 further includes a partitioning unit 11, the partitioning unit 11 is configured to cause a corresponding frequency of multiple demarcation points of (M+1) intervals to be $f_0, f_1, \ldots, f_i, f_{i+1}, \ldots, f_{M-1}$, for a frequency point $f_i$, divide the actual sampling clock phase mismatch error range at 2N equal intervals, cause the multiple actual sampling clock phase mismatch error points to be $$-aT_s, -\frac{N-1}{N}aT_s, \ldots, -\frac{1}{N}aT_s, 0, \frac{1}{N}aT_s, \ldots, \frac{N-1}{N}aT_s, aT_s,$$

respectively, where $T_s$ is a system sampling period, and a is a constant number.

In an embodiment, the statistic module 20 includes a statistic unit 21, a fitting unit 22, an acquisition unit 23 and a storage unit 24.

The statistic unit 21 is configured to perform a statistic according to an estimation operator $E\lfloor(x_2-x_1)^2\rfloor - E\lfloor(x_3-x_2)^2\rfloor$ of the modular square subtraction method to obtain an estimation value $s_{-N}, s_{-(N-1)}, \ldots, s_{-1}, 0, s_1, \ldots, s_{(N-1)}, s_N$ corresponding to each sampling clock phase mismatch error point.

The fitting unit 22 is configured to perform a linear fitting on multiple actual sampling clock phase mismatch error points $$-aT_s, -\frac{N-1}{N}aT_s, \ldots, -\frac{1}{N}aT_s, 0, \frac{1}{N}aT_s, \ldots, \frac{N-1}{N}aT_s, aT_s$$

and corresponding estimation values $s_{-N}, s_{-(N-1)}, \ldots, s_{-1}, 0, s_1, \ldots, s_{(N-1)}, s_N$ to obtain a slope k of a sampling clock phase mismatch error line segment corresponding to the frequency point $f_i$ and an offset value $b_i$ in a case where the sampling clock phase mismatch error is 0.

The acquisition unit 23 is configured to perform a same operation for other frequency points to obtain slopes of sampling clock phase mismatch error line segments corresponding to different frequency points and offset values in a case where the sampling clock phase mismatch error is 0.

The storage unit 24 is configured to store slopes $k_0, k_1, \ldots, k_i, k_{i+1}, \ldots, k_{M-1}$ and offset values $b_0, b_1, \ldots, b_i, b_{i+1}, \ldots, b_{M-1}$ corresponding to the multiple frequency points $f_0, f_1, \ldots, f_i, f_{i+1}, \ldots f_{M-1}$.

In an embodiment, the estimation module 30 includes a conversion module 31, an inquiry module 32 and an interpolation module 33.

The conversion module 31 is configured to convert the slope k of the proportion line segment corresponding to the real-time estimation frequency according to the estimation value obtained by the estimation operator of the modular square subtraction method.

The inquiry module 32 is configured to inquire an obtained k in $k_0, k_1, \ldots, k_i, k_{i+1}, \ldots, k_{M-1}$ to find that a slope range corresponding to the obtained k is between $k_i$ and $k_{i+1}$.

The interpolation module 33 is configured to estimate an offset value b corresponding to the real-time estimation frequency through a following interpolation:

$$A = \frac{k_{i+1} - k}{k - k_i} = \frac{b_{i+1} - b}{b - b_i}, b = (b_{i+1} + Ab_i)/(1 + A)$$

In an embodiment, the apparatus further includes a sampling module 40 and an output module 50.

The sampling module 40 is configured to, before the slope of the corresponding proportion line segment at the frequency is converted according to the error estimation value, sample the input signal, and the error estimation value is calculated by using the modular square subtraction method.

The output module 50 is configured to output the estimated actual value of the sampling clock phase mismatch error to a compensator for an error compensation.

The multiple modules described above may be implemented by software or hardware, and for the latter, without limitation, may be implemented in the following manner: the modules described above are all located in a same processor; or the multiple modules described above are located in different processors in an arbitrary combination manner, respectively.

An embodiment of the present disclosure further provides a non-transitory computer-readable storage medium. The storage medium stores a computer program, where the computer program is configured to, when being executed, perform the steps of any one of the method embodiments described above.

In this embodiment, the storage medium described above may include, but is not limited to, a USB flash disk, a ROM, a RAM, a removable hard disk, a magnetic disk, an optical disk, or other media that may store the computer program.

Embodiments of the present disclosure further provide an electronic apparatus, the electronic apparatus includes a memory and a processor, the memory stores a computer program, and the processor is configured to run the computer program to perform the steps of any one of the method embodiments described above.

In an embodiment, the electronic apparatus may further include a transmission device and an input/output device, the transmission device is connected to the above processor, and the input/output device is connected to the processor.

The multiple modules or steps of the present disclosure described above may be implemented by a general-purpose computing device, the modules or steps may be concentrated on a single computing device or distributed on a network composed of multiple computing devices, and alternatively, the modules or steps may be implemented by program codes executable by the computing devices, so that the modules or steps may be stored in a storage device and executed by the computing device. In some circumstances, the illustrated or described steps may be executed in sequences different from those described herein, or the modules or steps may be made into various integrated circuit modules separately, or multiple modules or steps therein may be made into a single integrated circuit module for implementation. In this way, the present disclosure is not limited to any specific combination of hardware and software.

What is claimed is:

1. A sampling clock phase mismatch error estimation method, comprising:
   acquiring a proportional relation between an estimation operator of a modular square subtraction method corresponding to each frequency interval of a plurality of frequency intervals and a sampling clock phase mismatch error of a time-interleaved analog to digital converter (TIADC);
   performing a statistic on a slope and an offset value of a fitting proportion line segment between an actual value of a sampling clock phase mismatch error and an estimation value of the sampling clock phase mismatch error corresponding to a frequency demarcation point of each frequency interval of the plurality of frequency intervals, wherein the estimation value of the sampling clock phase mismatch error is determined according to a proportional relation corresponding to each frequency interval; and
   in a real-time estimation of the sampling clock phase mismatch error of the TIADC, converting a slope of a proportion line segment corresponding to a real-time estimation frequency according to an estimation value of the sampling clock phase mismatch error obtained by the estimation operator of the modular square subtraction method, and estimating an offset value corresponding to the real-time estimation frequency through an interpolation according to a counted slope and a counted offset value, and estimating the actual value of the sampling clock phase mismatch error according to a converted slope and an offset value estimated through the interpolation.

2. The method of claim 1, wherein before performing the statistic on the slope and the offset value of the fitting proportion line segment between the actual value of the sampling clock phase mismatch error and the estimation value of the sampling clock phase mismatch error corresponding to the frequency demarcation point of each frequency interval of the plurality of frequency intervals, the method further comprises:
   for the frequency demarcation point, dividing an actual sampling clock phase mismatch error range of the TIADC at equal intervals to obtain actual values corresponding to a plurality of sampling clock phase mismatch error points.

3. The method of claim 2, wherein performing the statistic on the slope and the offset value of the fitting proportion line segment between the actual value of the sampling clock phase mismatch error and the estimation value of the sampling clock phase mismatch error corresponding to the frequency demarcation point of each frequency interval of the plurality of frequency intervals comprises:
   performing an offline statistic to obtain an estimation value corresponding to each sampling clock phase mismatch error point according to the estimation operator of the modular square subtraction method;
   performing a linear fitting on actual values and estimation values corresponding to the plurality of sampling clock phase mismatch error points to obtain a slope and an offset value of a sampling clock phase mismatch error line segment corresponding to the frequency demarcation point; and
   storing the slope and the offset value corresponding to the frequency demarcation point.

4. The method of claim 1, wherein estimating the offset value corresponding to the real-time estimation frequency through the interpolation according to the counted slope and the counted offset value comprises:
   querying a slope range corresponding to the real-time estimation frequency in the counted slope, and obtaining an offset value of a demarcation point of the slope range according to the counted offset value; and
   estimating an offset value of the real-time estimation frequency through an interpolation according to a linear relation between the slope and the offset value.

5. The method of claim 2, wherein for the frequency demarcation point, dividing the actual sampling clock phase mismatch error range of the TIADC at equal intervals to obtain the actual values corresponding to the plurality of sampling clock phase mismatch error points comprises:
   for a frequency demarcation point $f_i$, dividing the actual sampling clock phase mismatch error range of the TIADC at 2N equal intervals to obtain following actual values corresponding to the plurality of sampling clock phase mismatch error points:

$$-aT_s, -\frac{N-1}{N}aT_s, \ldots, -\frac{1}{N}aT_s, 0, \frac{1}{N}aT_s, \ldots, \frac{N-1}{N}aT_s, aT_s,$$

wherein frequencies corresponding to a plurality of frequency demarcation points of (M+1) frequency intervals are respectively as follows: $f_0, f_1, \ldots, f_i, f_{i+1}, \ldots, f_{M-1}$, $T_s$ is a system sampling period, a is a constant number, M and N are both positive integers greater than or equal to 1, 0<i<M−1.

6. The method of claim 5, wherein performing the statistic on the slope and the offset value of the fitting proportion line segment between the actual value of the sampling clock phase mismatch error and the estimation value of the sampling clock phase mismatch error corresponding to the frequency demarcation point of each frequency interval of the plurality of frequency intervals comprises:

performing a statistic according to an estimation operator $E\lfloor(x_2-x_1)^2\rfloor-E\lfloor(x_3-x_2)^2\rfloor$ of the modular square subtraction method to obtain an estimation value $s_{-N}$, $s_{-(N-1)}$, ... , $s_{-1}$, $0$, $s_1$, ... , $s_{(N-1)}$, $s_N$ corresponding to each sampling clock phase mismatch error point of the plurality of sampling clock phase mismatch error points;

performing a linear fitting on actual values $$-aT_s, -\frac{N-1}{N}aT_s, \ldots, -\frac{1}{N}aT_s, 0, \frac{1}{N}aT_s, \ldots, \frac{N-1}{N}aT_s, aT_s$$

and estimated values $s_{-N}$, $s_{-(N-1)}$, ... , $s_{-1}$, $0$, $s_1$, ... , $s_{(N-1)}$, $s_N$ corresponding to the plurality of sampling clock phase mismatch error points to obtain a slope $k_i$ of a sampling clock phase mismatch error line segment corresponding to the frequency demarcation point $f_i$ and an offset value $b_i$ in a case where the sampling clock phase mismatch error is 0;

performing a same operation as the frequency demarcation point $f_i$ for other frequency demarcation points to obtain slopes of sampling clock phase mismatch error line segments corresponding to different frequency demarcation points and offset values in a case where the sampling clock phase mismatch error is 0; and storing slopes $k_0, k_1, \ldots, k_i, k_{i+1}, \ldots, k_{M-1}$ and offset values $b_0, b_1, \ldots, b_i, b_{i+1}, \ldots b_{M-1}$ corresponding to the plurality of frequency demarcation points $f_0, f_1, \ldots, f_i, f_{i+1}, \ldots, f_{M-1}$.

7. The method of claim 6, wherein converting the slope of the proportion line segment corresponding to the real-time estimation frequency according to the estimation value of the sampling clock phase mismatch error obtained by the estimation operator of the modular square subtraction method, and estimating the offset value corresponding to the real-time estimation frequency through the interpolation according to the counted slope and the counted offset value comprises:

converting the slope k of the proportion line segment corresponding to the real-time estimation frequency according to the estimation value of the sampling clock phase mismatch error obtained by the estimation operator of the modular square subtraction method;

inquiring an obtained k in $k_0, k_1, \ldots, k_i, k_{i+1}, \ldots, k_{M-1}$ to find that a slope range corresponding to the obtained k is between $k_i$ and $k_{i+1}$; and estimating an offset value b corresponding to the real-time estimation frequency through a following interpolation:

$$A = \frac{k_{i+1} - k}{k - k_i} = \frac{b_{i+1} - b}{b - b_i};$$

$$b = (b_{i+1} + Ab_i)/(1 + A).$$

8. The method of claim 1, wherein after estimating the actual value of the sampling clock phase mismatch error according to the converted slope and the offset value estimated through the interpolation, the method further comprises:

outputting an estimated actual value of the sampling clock phase mismatch error to a compensator for an error compensation.

9. The method of claim 1, wherein the proportional relation corresponding to each frequency interval is linear approximation.

10. A non-transitory computer-readable storage medium, storing a computer program, wherein the computer program is configured to, when being executed, implement the sampling clock phase mismatch error estimation method of claim 1.

11. A sampling clock phase mismatch error estimation apparatus, comprising:

a processor and a memory storing processor-executable instructions which, when executed by the processor, cause the processor to:

acquire a proportional relation between an estimation operator of a modular square subtraction method corresponding to each frequency interval of a plurality of frequency intervals and a sampling clock phase mismatch error of a time-interleaved analog to digital converter (TIADC);

perform an statistic on a slope and an offset value of a fitting proportion line segment between an actual value of a sampling clock phase mismatch error and an estimation value of the sampling clock phase mismatch error corresponding to a frequency demarcation point of each frequency interval of the plurality of frequency intervals, wherein the estimation value of the sampling clock phase mismatch error is determined according to a proportional relation corresponding to each frequency interval; and convert, in a real-time estimation of the sampling clock phase mismatch error of the TIADC, a slope of a proportion line segment corresponding to a real-time estimation frequency according to an estimation value of the sampling clock phase mismatch error obtained by the estimation operator of the modular square subtraction method, estimate an offset value corresponding to the real-time estimated frequency through an interpolation according to a counted slope and a counted offset value, and estimate the actual value of the sampling clock phase mismatch error according to a converted slope and an offset value estimated through the interpolation.

12. The sampling clock phase mismatch error estimation apparatus of claim 11, wherein the processor-executable instructions which, when executed by the processor, cause the processor to further perform:

for the frequency demarcation point, dividing an actual sampling clock phase mismatch error range of the TIADC at equal intervals to obtain actual values corresponding to a plurality of sampling clock phase mismatch error points.

13. The sampling clock phase mismatch error estimation apparatus of claim 12, wherein the processor-executable instructions which, when executed by the processor, cause the processor to perform performing the statistic on the slope and the offset value of the fitting proportion line segment between the actual value of the sampling clock phase mismatch error and the estimation value of the sampling clock phase mismatch error corresponding to the frequency demarcation point of each frequency interval of the plurality of frequency intervals in the following way:

performing an offline statistic to obtain an estimation value corresponding to each sampling clock phase mismatch error point according to the estimation operator of the modular square subtraction method;

performing a linear fitting on actual values and estimation values corresponding to the plurality of sampling clock phase mismatch error points to obtain a slope and an offset value of a sampling clock phase mismatch error line segment corresponding to the frequency demarcation point; and storing the slope and the offset value corresponding to the frequency demarcation point.

14. The sampling clock phase mismatch error estimation apparatus of claim 11, wherein the processor-executable instructions which, when executed by the processor, cause the processor to perform estimating the offset value corresponding to the real-time estimation frequency through the interpolation according to the counted slope and the counted offset value in the following way:

querying a slope range corresponding to the real-time estimation frequency in the counted slope, and obtaining an offset value of a demarcation point of the slope range according to the counted offset value; and estimating an offset value of the real-time estimation frequency through an interpolation according to a linear relation between the slope and the offset value.

15. The sampling clock phase mismatch error estimation apparatus of claim 12, wherein the processor-executable instructions which, when executed by the processor, cause the processor to perform: for the frequency demarcation point, dividing the actual sampling clock phase mismatch error range of the TIADC at equal intervals to obtain the actual values corresponding to the plurality of sampling clock phase mismatch error points in the following way:

for a frequency demarcation point $f_i$, dividing the actual sampling clock phase mismatch error range of the TIADC at 2N equal intervals to obtain following actual values corresponding to the plurality of sampling clock phase mismatch error points:

$$-aT_s, -\frac{N-1}{N}aT_s, \ldots, -\frac{1}{N}aT_s, 0, \frac{1}{N}aT_s, \ldots, \frac{N-1}{N}aT_s, aT_s,$$

wherein frequencies corresponding to a plurality of frequency demarcation points of (M+1) frequency intervals are respectively as follows: $f_0, f_1, \ldots, f_i, f_{i+1}, \ldots, f_{M-1}$, $T_s$ is a system sampling period, a is a constant number, M and N are both positive integers greater than or equal to 1, 0i<M−1.

16. The sampling clock phase mismatch error estimation apparatus of claim 15, wherein the processor-executable instructions which, when executed by the processor, cause the processor to perform performing the statistic on the slope and the offset value of the fitting proportion line segment between the actual value of the sampling clock phase mismatch error and the estimation value of the sampling clock phase mismatch error corresponding to the frequency demarcation point of each frequency interval of the plurality of frequency intervals in the following way:

performing a statistic according to an estimation operator $E\lfloor(x_2-x_1)^2\rfloor-E\lfloor(x_3-x_2)^2\rfloor$ of the modular square subtraction method to obtain an estimation value $s_{-N}$, $s_{-(N-1)}, \ldots, s_{-1}, 0, s_1, \ldots, s_{(N-1)}, s_N$ corresponding to each sampling clock phase mismatch error point of the plurality of sampling clock phase mismatch error points;

performing a linear fitting on actual values $$-aT_s, -\frac{N-1}{N}aT_s, \ldots, -\frac{1}{N}aT_s, 0, \frac{1}{N}aT_s, \ldots, \frac{N-1}{N}aT_s, aT_s$$

and estimations values $s_{-N}, s_{-(N-1)}, \ldots, s_{-1}, 0, s_1, \ldots, s_{(N-1)}, s_N$ corresponding to the plurality of sampling clock phase mismatch error points to obtain a slope $k_i$ of a sampling clock phase mismatch error line segment corresponding to the frequency demarcation point $f_i$ and an offset value $b_i$ in a case where the sampling clock phase mismatch error is 0;

performing a same operation as the frequency demarcation point $f_i$ for other frequency demarcation points to obtain slopes of sampling clock phase mismatch error line segments corresponding to different frequency demarcation points and offset values in a case where the sampling clock phase mismatch error is 0; and storing slopes $k_0, k_1, \ldots, k_i, k_{i+1}, \ldots, k_{M-1}$ and offset values $b_0, b_1, \ldots, b_i, b_{i+1}, \ldots b_{M-1}$ corresponding to the plurality of frequency demarcation points $f_0, f_1, \ldots, f_i, f_{i+1}, \ldots, f_{M-1}$.

17. The sampling clock phase mismatch error estimation apparatus of claim 16, wherein the processor-executable instructions which, when executed by the processor, cause the processor to perform converting the slope of the proportion line segment corresponding to the real-time estimation frequency according to the estimation value of the sampling clock phase mismatch error obtained by the estimation operator of the modular square subtraction method, and estimating the offset value corresponding to the real-time estimation frequency through the interpolation according to the counted slope and the counted offset value in the following way:

converting the slope k of the proportion line segment corresponding to the real-time estimation frequency according to the estimation value of the sampling clock phase mismatch error obtained by the estimation operator of the modular square subtraction method;

inquiring an obtained k in $k_0, k_1, \ldots, k_i, k_{i+1}, \ldots, k_{M-1}$ to find that a slope range corresponding to the obtained k is between $k_i$ and $k_{i+1}$; and estimating an offset value b corresponding to the real-time estimation frequency through a following interpolation:

$$A = \frac{k_{i+1} - k}{k - k_i} = \frac{b_{i+1} - b}{b - b_i};$$

$$b = (b_{i+1} + Ab_i)/(1 + A).$$

18. The sampling clock phase mismatch error estimation apparatus of claim 11, wherein the processor-executable instructions which, when executed by the processor, cause the processor to further perform:

outputting an estimated actual value of the sampling clock phase mismatch error to a compensator for an error compensation.

19. The sampling clock phase mismatch error estimation apparatus of claim 11, wherein the proportional relation corresponding to each frequency interval is linear approximation.

20. An electronic apparatus, comprising a memory and a processor, wherein the memory stores a computer program, and the processor is configured to execute:

acquiring a proportional relation between an estimation operator of a modular square subtraction method corresponding to each frequency interval of a plurality of frequency intervals and a sampling clock phase mismatch error of a time-interleaved analog to digital converter (TIADC);

performing a statistic on a slope and an offset value of a fitting proportion line segment between an actual value of a sampling clock phase mismatch error and an estimation value of the sampling clock phase mismatch error corresponding to a frequency demarcation point of each frequency interval of the plurality of frequency intervals, wherein the estimation value of the sampling clock phase mismatch error is determined according to a proportional relation corresponding to each frequency interval; and in a real-time estimation of the sampling clock phase mismatch error of the TIADC, converting a slope of a proportion line segment corresponding to a real-time estimation frequency according to an estimation value of the sampling clock phase mismatch error obtained by the estimation operator of the modular square subtraction method, and estimating an offset value corresponding to the real-time estimation frequency through an interpolation according to a counted slope and a counted offset value, and estimating the actual value of the sampling clock phase mismatch error according to a converted slope and an offset value estimated through the interpolation.

* * * * *